(12) United States Patent
Shero

(10) Patent No.: US 12,068,164 B2
(45) Date of Patent: Aug. 20, 2024

(54) BOTTOM-UP METAL NITRIDE FORMATION

(71) Applicant: ASM IP HOLDING B.V., Almere (NL)

(72) Inventor: Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 407 days.

(21) Appl. No.: 17/470,426

(22) Filed: Sep. 9, 2021

(65) Prior Publication Data

US 2022/0084831 A1 Mar. 17, 2022

Related U.S. Application Data

(60) Provisional application No. 63/078,192, filed on Sep. 14, 2020.

(51) Int. Cl.
| | |
|---|---|
| *H01L 21/285* | (2006.01) |
| *C23C 16/04* | (2006.01) |
| *C23C 16/34* | (2006.01) |
| *C23C 16/44* | (2006.01) |
| *C23C 16/455* | (2006.01) |
| *C23C 16/56* | (2006.01) |

(52) U.S. Cl.
CPC ...... *H01L 21/28568* (2013.01); *C23C 16/045* (2013.01); *C23C 16/34* (2013.01); *C23C 16/4408* (2013.01); *C23C 16/45527* (2013.01); *C23C 16/56* (2013.01)

(58) Field of Classification Search
CPC ......... H01L 21/28568; H01L 21/76879; H01L 21/28556; H01L 21/32135; C23C 16/045; C23C 16/34; C23C 16/4408; C23C 16/45527; C23C 16/56
See application file for complete search history.

(56) References Cited

U.S. PATENT DOCUMENTS

| | | | |
|---|---|---|---|
| 6,706,115 | B2 | 3/2004 | Leskeläet et al. |
| 6,863,727 | B1 | 3/2005 | Elers et al. |
| 6,986,914 | B2 | 1/2006 | Elers et al. |
| 9,412,602 | B2 | 8/2016 | Blomberg et al. |
| 10,273,584 | B2 | 4/2019 | Blomberg et al. |
| 10,280,519 | B2 | 5/2019 | Blomberg et al. |

(Continued)

FOREIGN PATENT DOCUMENTS

WO WO 2017/099718 6/2017

OTHER PUBLICATIONS

Leskelä et al., "Atomic Layer Deposition (ALD): from Precursors to Thin Film Structures", Thin Solid Films, 409, 2002, pp. 138-146.

*Primary Examiner* — Marc Anthony Armand
(74) *Attorney, Agent, or Firm* — Snell & Wilmer L.L.P.

(57) ABSTRACT

Vapor deposition processes are provided for bottom up filling of trenches and other structures with metal nitrides such as vanadium nitride and titanium nitride. In some embodiments, $VCl_4$ can be used as an etchant source in the deposition processes. The reaction conditions are selected such that some $Cl_2$ forms in the reaction space and preferentially etches deposited metal nitride at the upper surfaces of a trench or other three-dimensional feature on a substrate. The self-etching during the deposition process facilitates a bottom up filling of the feature and may reduce or eliminate the formation of seams or voids.

19 Claims, 6 Drawing Sheets

(56) References Cited

U.S. PATENT DOCUMENTS

| | | |
|---|---|---|
| 10,283,319 B2 | 5/2019 | Blomberg et al. |
| 10,636,889 B2 | 4/2020 | Haukka et al. |
| 10,714,350 B2 * | 7/2020 | Chen ................ H01L 21/28568 |
| 2018/0158688 A1 * | 6/2018 | Chen ................ H01L 23/53266 |
| 2021/0125832 A1 | 4/2021 | Bhatnagar |
| 2021/0175088 A1 | 6/2021 | Dezelah et al. |

* cited by examiner

BOTTOM-UP METAL NITRIDE FORMATION

REFERENCE TO RELATED APPLICATION

This application claims priority to U.S. Provisional Application No. 63/078,192, filed Sep. 14, 2020, which is incorporated by reference herein.

FIELD

The present disclosure relates generally to the field of semiconductor device manufacturing and, more particularly, to deposition of metal nitride films, such as vanadium nitride films.

BACKGROUND

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes. As FinFET scales, and with the rise of gate-all-around (GAA) FETs, there is minimal space for barrier, capping and work function layers. Thus, it would be advantageous for metal nitrides used in these areas to be grown bottom-up in three-dimensional structures.

SUMMARY

In some aspects methods of depositing metal nitride on a substrate in a reaction chamber by a vapor deposition process are provided. The metal nitride may be deposited, for example, in a three-dimensional structure such as a trench or via in the substrate. In some embodiments an etchant precursor comprises $VCl_4$ and the reaction conditions are selected such that some $Cl_2$ forms in the reaction space and preferentially etches deposited metal nitride at the upper surfaces of the trench or other three-dimensional feature on a substrate. The self-etching during the deposition process facilitates a bottom up filling of the feature and may reduce or eliminate the formation of seams or voids.

In some embodiments metal nitride, such as vanadium nitride or titanium nitride, is deposited in a trench or via on a substrate in a reaction space by a vapor deposition process comprising one, two or more deposition-etch cycles. The deposition-etch cycle may comprise a deposition cycle and an etch cycle. In some embodiments the deposition cycle comprises providing a pulse of a metal precursor to the reaction space, providing a pulse of a nitrogen precursor into the reaction space and removing excess metal precursor and nitrogen precursor from the reaction space. In some embodiments the process comprises at least one etch cycle comprising providing a pulse of an etchant source comprising $VCl_4$ into the reaction chamber and removing excess etchant source and reaction byproducts from the reaction chamber. In some embodiments the etchant source is provided for a pulse having a longer duration than the pulse of the metal precursor.

In some embodiments vanadium nitride or titanium nitride is deposited by the vapor deposition process. In some embodiments the metal precursor comprises $VCl_4$. In some embodiments the nitrogen precursor comprises at least one of ammonia, hydrazine and an alkyl-hydrazine precursor. In some embodiment the etchant source consists of $VCl_4$.

In some embodiments the deposition cycle is repeated two or more times prior to conducting an etch cycle in the deposition process. The deposition-etch cycle is repeated until a desired amount of metal nitride has been deposited. In some embodiments the deposition-etch cycle is repeated until a trench or via is filled with metal nitride. In some embodiments at least 95% of a trench is filled with metal nitride without any substantial seams or voids forming in the filled volume.

In some embodiments, removing excess metal precursor and nitrogen precursor from the reaction chamber comprises removing excess metal precursor after providing the pulse of the metal precursor into the reaction chamber and before providing the pulse of the nitrogen precursor into the reaction chamber. In some embodiments, removing excess metal precursor and nitrogen precursor from the reaction chamber comprises removing excess metal precursor and excess nitrogen precursor after providing the pulse of the metal precursor into the reaction chamber and after providing the pulse of the nitrogen precursor into the reaction chamber.

In some embodiments methods of filling a trench in a substrate in a reaction space with vanadium nitride comprise a plurality of vapor deposition cycles comprising providing a pulse of vapor phase $VCl_4$ to the reaction space under conditions such that $VCl_2$ and $Cl_2$ are formed in the reaction space and providing a pulse of a nitrogen reactant to the reaction space. The $Cl_2$ formed in the reaction space may preferentially etch vanadium nitride deposited at the top of the trench relative to vanadium nitride deposited at the bottom of the trench. In some embodiments, excess vapor phase $VCl_4$ and reaction byproducts are removed from the reaction space after providing the pulse of vapor phase $VCl_4$ and prior to providing the pulse o the nitrogen reactant to the reaction space.

In some embodiments the methods are atomic layer deposition methods. In some embodiments the methods are chemical vapor deposition methods. In some embodiments the methods are carried out at a temperature between 350 and 450° C.

BRIEF DESCRIPTION OF THE DRAWINGS

The appended drawings are meant to illustrate and not to limit various embodiments, and wherein.

DETAILED DESCRIPTION

Figure 1:
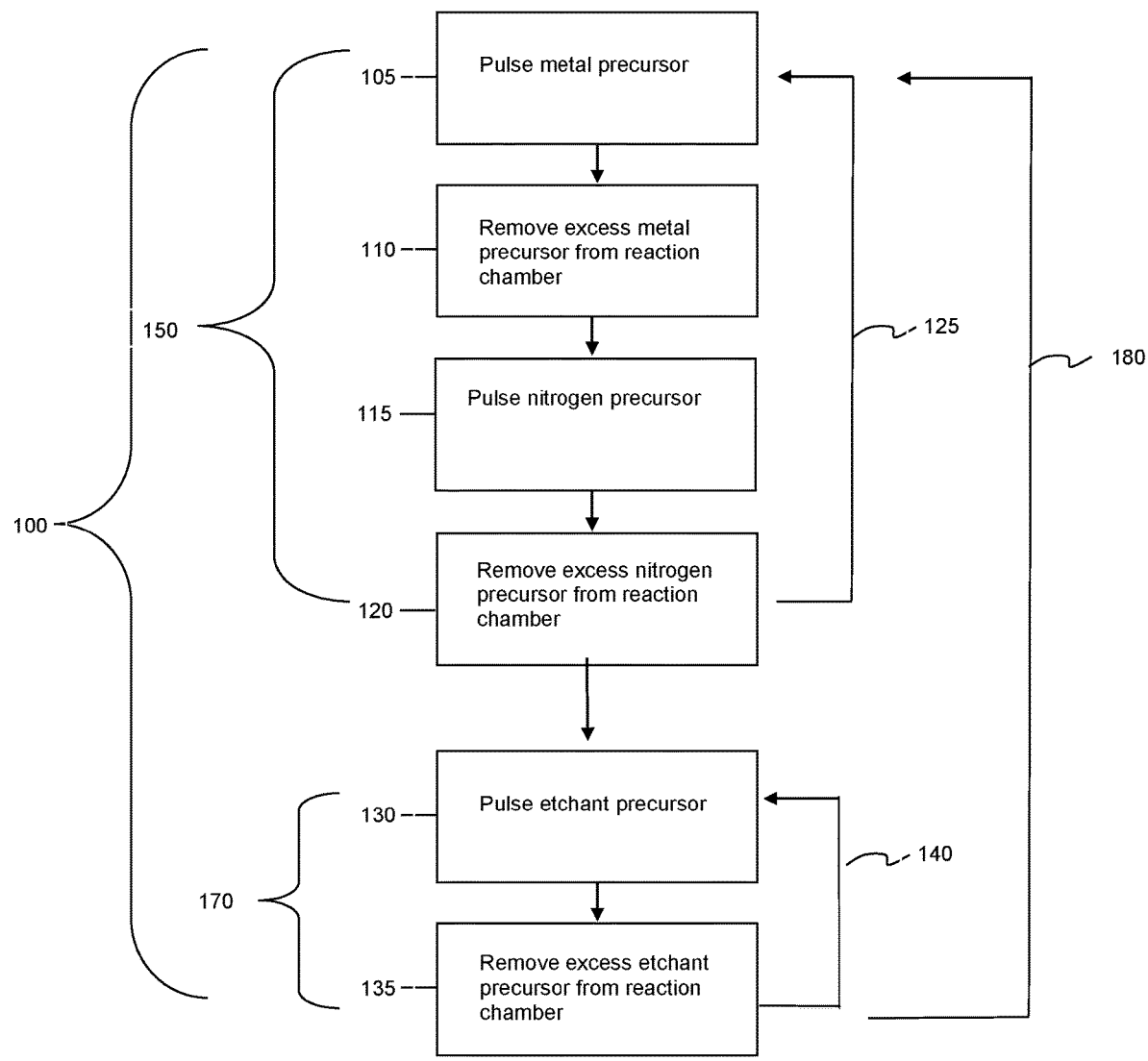
FIG. 1 is a flow chart generally illustrating a method of forming a metal nitride film by a vapor deposition process comprising a deposition-etch cycle in accordance with some embodiments of the present disclosure.

Metal nitride films can be used in a wide variety of contexts, including as barrier, capping and work function layers in semiconductor devices such as FinFETS or gate-all-around (GAA) FETS. In some aspects, methods of depositing metal nitride films, such as TiN or VN films by vapor deposition are provided. The metal nitride films may be used in a gapfill process to fill a feature in a patterned semiconductor substrate. For example, in some embodiments a metal nitride can serve as a conductive barrier within an opening in a dielectric layer.

In some embodiments metal nitride films are deposited on a three-dimensional structure in a patterned substrate, such as a trench, hole or via. Although described primarily with respect to filling a trench, the methods disclosed herein can be applied to other three-dimensional structures. In some embodiments the structures have high aspect ratios (e.g., aspect ratios of about 6 or higher) or complex morphology.

The reactants and deposition conditions may be selected to achieve a bottom-up deposition. In some embodiments reactants and reaction conditions are selected such that some etching of the deposited film occurs during the deposition process. In particular, in some embodiments an etchant is contacted with the substrate such that the top portions of the trench are etched faster than the bottom or more interior portions of the trench. As a result, the bottom or interior fills first and the feature is filled from the bottom up. By filling from the bottom up, defects such as voids may be reduced or avoided.

As discussed in more detail below, in some embodiments the metal nitride is deposited by a vapor deposition process comprising a deposition-etch cycle, also referred to as a deposition-etch supercycle, comprising a deposition cycle (also referred to as a deposition subcycle) and an etch cycle (also referred to as an etch subcycle). The deposition cycle may comprise contacting the substrate with a metal precursor and a nitrogen precursor, for example in an ALD- or CVD-type deposition cycle. The etch cycle may comprise providing an etchant source to the reaction space under conditions such that the etchant source forms an etchant that contacts the substrate surface. In some embodiments the etchant preferentially etches the deposited metal nitride at the top portions of the trench.

The deposition and etch cycles are repeated to form a metal nitride layer of a desired thickness. For example, they may be repeated until a trench or other feature is filled with metal nitride. In some embodiments the deposition and etch cycles are repeated to fill the trench from the bottom up. In some embodiments the deposition and etch cycles are both provided in each supercycle. In some embodiments the etch cycle is not provided in every deposition-etch supercycle, but rather is provided in one or more deposition-etch supercycles in the deposition process. For example, the etch cycle may be provided at intervals in the deposition process, or at a selected ratio with the deposition cycles in the overall deposition process.

In some embodiments a metal precursor can serve as both a metal source and as an etchant source. Thus, metal nitride may be deposited by repetition of a single metal nitride deposition cycle utilizing the metal precursor and the nitrogen precursor. In some embodiments no separate etch cycles are provided in the deposition process. In some embodiments, however, one or more etch cycles may be included in the overall deposition process.

In some embodiments $VCl_4$ is used as the vapor phase etchant source and $Cl_2$ generated from the $VCl_4$ in the reaction chamber serves as the etchant. While $Cl_2$ is able to etch growing metal nitride films, such as TiN or VN films, if $Cl_2$ is provided directly, for example from a remote source, it can undesirably interact with materials upstream of the substrate. In addition, providing $Cl_2$ directly requires a more complex system for delivering reactants to the reaction chamber. In order to avoid these issues, $Cl_2$ can be generated in the reaction chamber by using $VCl_4$ as an etchant source and/or a vanadium source. $VCl_4$ decomposes into $VCl_2$ and $Cl_2$ under certain reaction conditions. By controlling the reaction conditions, the generation of $Cl_2$ at the substrate can be controlled, allowing for control of the etch activity in the deposition process and the overall deposition characteristics of the metal nitride. In particular, in some embodiments the deposition process is tuned to provide for more net growth of the metal nitride film at interior or lower surfaces of a three-dimensional feature such as a trench or via than at top surfaces, which are more subject to etching by the generated $Cl_2$. This can provide bottom up growth of metal nitride in the feature.

In some embodiments in a metal nitride deposition process $VCl_4$ serves as an etchant source, and may be provided to the reaction chamber under conditions such that $Cl_2$ is formed in the reaction chamber and contacts the substrate. In some embodiments $VCl_4$ is provided separately from the metal precursor and serves as an etchant source in a deposition process for depositing VN, TiN or another metal nitride. For example, in some embodiments a metal precursor is provided in a deposition subcycle and $VCl_4$ is provided in an etch subcycle to serve as an etchant source. In some embodiments the metal precursor is not $VCl_4$. In some embodiments in which vanadium nitride is deposited, both the metal source and the etchant source may be $VCl_4$. In some embodiments the etchant source, $VCl_4$, is provided for a longer pulse time than the metal precursor. In some embodiments the $VCl_4$ is provided for a pulse time that is 2, 3, 4, 5, 10, 15, 20, 50 or more times longer than the pulse time of the metal precursor.

In some embodiments a separate etch subcycle is not utilized and $VCl_4$ serves as both a metal source for depositing VN and as an etchant source in a deposition cycle. That is, in some embodiments $VCl_4$ is used as a vanadium source in the vapor deposition of vanadium nitride and the same pulse of $VCl_4$ serves as both the source of vanadium and a source of $Cl_2$ that serves as an etchant. When a pulse of $VCl_4$ serves as both the metal source and the etchant source in a deposition cycle, throughput can be increased relative to a process in which a metal source and an etchant source are separately provided.

As described herein, the deposition cycle, whether carried out in conjunction with an etch subcycle or not, can comprise atomic layer deposition- (ALD) or chemical vapor deposition (CVD)-type processes. In some embodiments the deposition cycle may comprise co-flowing the metal precursor and the nitrogen precursor such that they are delivered to the substrate at the same time. In some embodiments $VCl_4$ is utilized as an etchant precursor and the reaction conditions are selected such that $VCl_4$ decomposes in the reaction space to form $Cl_2$, which is able to etch the deposited metal nitride.

Although described herein primarily in the context of deposition of vanadium nitride thin films, other metal nitride films can be deposited by analogous processes. For example, in some embodiments titanium nitride films are deposited and etched by the disclosed methods.

In some embodiments, a deposition cycle comprises contacting a substrate with a vapor phase metal precursor and a vapor phase nitrogen precursor. The vapor phase metal precursor may comprise a metal halide (such as a titanium halide or vanadium halide), a metal oxyhalide, a metal beta-diketonate compound, a metal cyclopentadienyl compound, a metal alkoxide compound, a metal amidinate compound, a metal heterolyeptic or mixed ligand compound. In some embodiments, at least one of a vanadium oxyfluoride, a vanadium oxychloride, a vanadium oxybromide, a vanadium oxyiodide, vanadium tetrachloride ($VCl_4$), vanadium tetrabromide, vanadium tetraiodide, vanadium oxytrichloride, vanadium oxytribromide, or vanadium oxytriiodide may be used as the metal precursor to deposit vanadium nitride. In some embodiments, titanium tetrachloride ($TiCl_4$) or titanium tetraiodide ($TiI_4$) may be used to deposit titanium nitride. Additional vapor phase metal precursors are disclosed in U.S. Provisional Patent Application No. 63/015,229, entitled "Method of Forming Structures Including a Vanadium or Iridium Layer" and incorporated by reference.

In some embodiments the vapor phase nitrogen precursor comprises at least one of ammonia ($NH_3$), hydrazine ($N_2H_4$), and an alkyl-hydrazine precursor. In embodiments in which the nitrogen containing reactant comprises an alkyl-hydrazine precursor, the alkyl-hydrazine precursor may comprise at least one of tertbutylhydrazine ($C_4H_9N_2H_3$), methylhydrazine ($CH_3NHNH_2$), dimethylhydrazine (($CH_3)_2N_2H_2$). In embodiments in which the nitrogen containing reactant comprises an alkyl-hydrazine precursor, the alkyl group might be C1-C4 linear or branched alkyl group, such as Me, Et, $^n$Pr, $^i$Pr, $^n$Bu, $^i$Bu or $^t$Bu. In some embodiments, the nitrogen precursor may comprise nitrogen radicals, atomic nitrogen or plasma comprising nitrogen. In some embodiments the nitrogen precursor may also comprise hydrogen radicals, atomic hydrogen or plasma comprising hydrogen. In some embodiments, the nitrogen precursor may comprise excited species of nitrogen and/or hydrogen. In some embodiments, the nitrogen precursor comprising excited species, plasma, radicals or atomic nitrogen and/or hydrogen may be formed from $NH_3$ or from $N_2H_4$.

As discussed above, in some embodiments, the methods for depositing a metal nitride film in a trench or other feature on a substrate include a deposition cycle. In some embodiments, the deposition cycle may comprise an ALD-type deposition process or a CVD-type deposition process. ALD-type processes are based on controlled, typically self-limiting surface reactions of the precursor chemicals. Gas phase reactions are avoided by feeding the precursors alternately and sequentially into the reaction chamber. In some embodiments utilizing an ALD-type deposition cycle, a metal precursor (also referred to as a metal reactant), a nitrogen precursor (also referred to as a nitrogen reactant) are alternately and sequentially provided to a reaction space comprising a substrate comprising a three-dimensional structure such as a trench or via.

In ALD-type deposition cycles vapor phase reactants are separated from each other in the reaction chamber, for example, by removing excess reactants and/or reactant byproducts from the reaction chamber between reactant pulses. This may be accomplished with an evacuation step and/or with an inactive gas pulse or purge. In some embodiments the substrate is contacted with a purge gas, such as an inactive gas. For example, the substrate may be contacted with a purge gas between reactant pulses to remove excess reactant and reaction by-products.

Deposition cycles comprising CVD-type processes typically involve gas phase reactions between two or more reactants. The reactants can be provided simultaneously to the reaction space or substrate, or in partially or completely separated pulses. The substrate and/or reaction space can be heated to promote the reaction between the gaseous reactants. In some embodiments cyclical CVD type processes can be used with multiple deposition cycles to deposit a thin film having a desired thickness. In cyclical CVD-type processes, the reactants may be provided to the reaction chamber in pulses that do not overlap, or that partially or completely overlap.

In some embodiments the deposition cycle may operate in a process condition regime close to CVD conditions or in some cases fully in CVD conditions. In some embodiments a sequential or pulsed CVD process is utilized. In some embodiments a metal nitride such as vanadium nitride or titanium nitride is deposited by a deposition cycle comprising a pulsed CVD process in which multiple pulses of a first reactant comprising a metal precursor, such as a vanadium halide or titanium halide, and a second reactant comprising a nitrogen precursor are separated by purge or removal steps in which reactant is removed from the substrate surface. For example, the substrate may be exposed to a purge gas between reactant pulses. In some embodiments the substrate is contacted with a purge gas between a pulse of a reactant and the pulse of the subsequent reactant. In some embodiments the substrate is contacted with a purge gas following each reactant pulse.

In some embodiments an ALD-type process can be modified to be at least a partial CVD process. In some embodiments a partial CVD process can include at least partial decomposition of one or more precursors and/or at least partial overlap of two or more reactants. In some embodiments ALD processes can be modified to be a sequential or pulsed CVD process. A sequential or pulsed CVD process may utilize the same precursors and reaction conditions such as temperature and pressure as a corresponding ALD process.

In some embodiments an ALD-type process is modified to use overlapping or partially overlapping pulses of reactants. In some embodiments an ALD process is modified to use extremely short purge or removal times, such as below 0.1 s (depending on the reactor). In some embodiments an ALD process is modified to use extremely long or continuous pulse times. For example, in some embodiments an ALD process is modified to use no purge or removal at all after at least one reactant pulse. In some embodiments no purge is used after a metal precursor pulse. In some embodiments no purge is used after a nitrogen precursor pulse In an etchant cycle, the etchant source reactant, $VCl_4$, is provided to the reaction space. The etchant source reactant decomposes at least partially to produce an etchant, $Cl_2$, that contacts the substrate surface. In some embodiments the etchant preferentially etches the top surfaces of a feature such as a trench or via relative to the bottom or inner surfaces. This preferential etching may be, for example, the result of a depletion effect. Because $Cl_2$ is produced in finite amounts, governed by the reaction conditions, it will preferentially etch the top surface and then deplete down into the feature. That is, more etchant is available at the top of the feature and progressively less etchant is available deeper into the feature. Excess etchant source reactant and reaction byproducts are removed from the reaction space, such as by purging and/or with a vacuum after an etchant source pulse. In some embodiments, no purge is used after an etchant source pulse.

Reaction conditions are selected to control the amount of etchant produced from the etchant source reactant. In particular, reaction conditions are selected to achieve the desired level of conversion of $VCl_4$ to $VCl_2$ and $Cl_2$, and thereby control or tune the amount of etching that is obtained in the deposition process. The appropriate reaction conditions for any given deposition process will depend upon a variety of factors including the surface on which the film is deposited, the nature of the three-dimensional structure, such as the width and aspect ratio of a trench being filled, and the particular reactant species involved. In some embodiments the reaction conditions that are tuned to achieve a desired level of etching of the deposited metal nitride include one or more of temperature, total pressure and mole fraction of $VCl_4$. In some embodiments one or more of temperature, total pressure and mole fraction of $VCl_4$ are tuned to achieve more net growth at the interior surfaces of a trench or other three-dimensional structure and less growth at upper surfaces.

In some embodiments, the deposition temperature is selected to achieve a desired level of etching. For example, the deposition temperature may be selected to achieve a desired bottom up growth in a gapfill process. At low temperatures, for example below about 300° C., virtually no $Cl_2$ is generated from $VCl_4$, and no etching of the deposited metal nitride is obtained. In some embodiments the temperature is selected such that the growth rate of the metal nitride film is higher in the bottom of a three-dimensional structure than in the top portions. In some embodiments temperature is selected such that a feature may be filled with metal nitride without the formation of voids or other defects.

In some embodiments, the deposition temperature is between about 300 and 600° C. In some embodiments, the deposition temperature is between about 350 and 550° C. In some embodiments, the deposition temperature is between 400 and 500° C. In some embodiments, the deposition temperature is between 400 and 450° C.

In some embodiments, the total pressure in the reaction space during the deposition process is between about 0.5 Torr and 50 Torr, between 1 Torr and 30 Torr, or between 5 Torr and 15 Torr Partial pressure of $VCl_4$ may range between 0.1 Torr and 10 Torr, between 0.5 Torr and 8 Torr, or between 1 and 5 Torr.

In some embodiments, the mole fraction of $VCl_4$ is between about 0.1% and 100%, between 0.5% and 50%, or between 1% and 10%. For high temperatures, the more fraction of $VCl_4$ may be on the lower end of the range, while for lower temperatures, the mole fraction of $VCl_4$ may be on the higher end of the range.

In some embodiments of an ALD-type deposition cycle, the surface of the substrate comprising a trench or other three-dimensional structure is contacted with a vapor phase first metal precursor, for example a vanadium precursor or titanium precursor. In some embodiments a pulse of vapor phase metal precursor is provided to a reaction space containing a substrate, for example a substrate comprising a three-dimensional feature such as a trench or via that is to be filled. In some embodiments the substrate is moved to a reaction space containing the vapor phase first metal precursor.

In some embodiments, the reaction conditions may be selected such that no more than about one monolayer of species of the first metal precursor is adsorbed on the substrate surface in a self-limiting manner. The appropriate contacting times can be determined by the skilled artisan based on the particular circumstances. Excess first reactant and reaction byproducts, if any, are removed from the substrate surface, such as by purging with an inert gas or by removing the substrate from the presence of the first reactant.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

Purging means that vapor phase precursors and/or vapor phase byproducts are removed from the substrate surface such as by evacuating the reaction chamber with a vacuum pump and/or by replacing the gas inside a reaction chamber with an inert gas such as argon or nitrogen. Typical purging times are from about 0.05 to 20 seconds, and can be about 0.2 and 10, or between about 0.5 and 5 seconds. However, other purge times can be utilized if necessary, such as where highly conformal step coverage over extremely high aspect ratio structures or other structures with complex surface morphology is needed, or where different reactor types may be used, such as a batch reactor.

The surface of the substrate is subsequently contacted with a vapor phase nitrogen precursor. The nitrogen precursor reacts with the metal-containing species from the first reactant adsorbed on the substrate surface.

In some embodiments a pulse of a nitrogen reactant is provided to a reaction space containing the substrate. In some embodiments the substrate is moved to a reaction space containing the vapor phase second nitrogen reactant.

Excess nitrogen reactant and gaseous byproducts of the surface reaction, if any, are removed from the substrate surface, for example by purging the reaction space or by moving the substrate from the reaction space containing the reactant.

As mentioned above, in some embodiments each reaction is self-limiting and monolayer by monolayer growth is achieved. These may be referred to as "true ALD" reactions. In some such embodiments the metal precursor may adsorb on the substrate surface in a self-limiting manner. The nitrogen precursor will react in turn with the adsorbed metal precursor species to form up to a monolayer of metal nitride, such as vanadium nitride or titanium nitride on the substrate.

However, in some embodiments ALD-type reactions are provided, in which there may be some precursor decomposition, but the growth saturates. That is, in some embodiments although a certain amount of film growth may be caused by thermal decomposition of the metal precursor at some deposition temperatures, saturated growth is \ achieved when the nitrogen precursor is utilized. Such a reaction is an example of an ALD-type reaction. In such ALD-type reactions, films with good uniformity and relatively few impurities can be deposited.

In some embodiments thermal decomposition of one or more reactants occurs, such as the metal precursor. In such cases, the growth rate may not fully plateau with increasing reactant pulse times. Rather, the growth rate may continue to rise with increased pulse times, although the growth rate may increase more slowly with ever increasing pulse times.

In some embodiments a CVD type deposition cycle is utilized in which the metal precursor and the nitrogen precursor are provided simultaneously to the reaction space. In some embodiments the metal precursor and nitrogen precursor are provided together into the reaction space. In some embodiments the metal precursor and nitrogen precursor are co-flowed into the reaction space.

As mentioned above, in some embodiments a metal nitride film, such as a vanadium nitride or titanium nitride film, is deposited in a trench or other feature on a substrate surface by a pulsed-CVD process in which a vapor phase metal precursor is intermittently pulsed into a reaction space comprising the substrate and purged from the reaction space. The substrate may be contacted with a nitrogen reactant, for example in a sequential pulse. The pulses of the metal precursor and nitrogen precursors may at least partially overlap.

In some embodiments one or more etch cycles is included in a metal nitride deposition-etch process. In some embodiments an etch cycle is included in every deposition-etch cycle. In some embodiments one or more etch cycles is included at regular intervals in the deposition process. In some embodiments one or more etch cycles is provided at a given ratio to the number of deposition cycles. For example, an etch cycle may be carried out every 1, 2, 3, 4, 5, 10, 20, 50 or more deposition cycles. In some embodiments two or more deposition cycles are carried out for each etch cycle. In some embodiments the ratio of deposition cycles to etch cycles is at least 10. The reaction space may be purged to remove any reactant and/or reaction byproducts between a deposition cycle and an etch cycle.

In some embodiments in the etch cycle a vapor phase gaseous reactant comprising an etchant source, such as $VCl_4$ is introduced into the reaction chamber. In some embodiments the etchant source is pulsed into the reaction chamber for a longer time than the metal source is pulsed into the reaction chamber in the deposition cycle. The etchant source decomposes to form $Cl_2$, which contacts the substrate and etches the metal nitride being deposited. As discussed above, etching preferentially occurs on the upper surfaces of the three-dimensional structure relative to lower surface.

Excess etchant source and gaseous byproducts, if any, are removed from the substrate surface, for example by purging the reaction space or by moving the substrate from the reaction space containing the reactant.

In some embodiments the deposition cycle and etch cycle together form a metal nitride deposition-etch cycle that is repeated until a metal nitride thin film of the desired composition and thickness has been formed on the three-dimensional feature of the substrate. In some embodiments the deposition-etch cycle is repeated until a trench, via or other feature is filled with metal nitride.

FIG. 1 is a flow chart generally illustrating a metal nitride deposition-etch cycle that can be used to deposit a metal nitride thin film in accordance with some embodiments. The deposition-etch cycle can be utilized in a gapfill process to fill a trench or other feature on a substrate surface. According to certain embodiments, a substrate comprising a three-dimensional feature, such as a trench or via, is placed in a reaction space. A metal nitride thin film is formed on the three-dimensional feature on the substrate by process comprising multiple metal nitride deposition-etch cycles 100, at least one metal nitride deposition-etch cycle 100 comprising a metal nitride deposition cycle 150 and an etch cycle 170.

The metal nitride deposition-etch cycle 100 may comprise:

providing a pulse of a metal precursor 105 to the reaction space such that metal-containing species adsorb on the substrate surface;

removing excess metal precursor and reaction by-products, if any, from the reaction space;

providing a pulse of a nitrogen precursor 115 to the reaction space; and removing excess nitrogen precursor and reaction by-products, if any, from the reaction space.

In some embodiments the etch cycle 170 immediately follows the metal nitride deposition cycle. In some embodiments the metal nitride deposition cycle 150 can be repeated 125. In some embodiments the metal nitride deposition cycle 150 is repeated 2 or more times prior to beginning the etch cycle 170.

The etch cycle 170 can comprise:

providing a pulse of an etchant precursor 130 to the reaction space; and removing excess etchant precursor and reaction by-products, if any, from the reaction space 135.

In some embodiments the etch cycle can be repeated 140 two or more times consecutively.

The deposition-etch cycle can be repeated 180 two or more times to deposit the desired amount of metal nitride. In some embodiments the deposition-etch cycle is repeated 280 until the three-dimensional feature is filled with metal nitride.

In some embodiments the etch cycle 170 is included in every deposition-etch cycle. In some embodiments the deposition cycle 150 is repeated two or more times consecutively without an etch cycle 170.

As discussed above, in some embodiments the metal nitride that is deposited is vanadium nitride and the metal precursor is a vanadium precursor, such as a vanadium halide. In some embodiments the metal precursor comprises $VCl_4$.

In some embodiments the metal nitride that is deposited is titanium nitride and the metal precursor is a titanium precursor, such as a titanium halide. In some embodiments the titanium precursor is $TiCl_4$.

In some embodiments the etchant precursor comprises $VCl_4$. In some embodiments the etchant precursor consists of $VCl_4$.

In some embodiments the deposition process is an ALD-type process in which the substrate is alternately and sequentially contacted with the vanadium precursor and the nitrogen precursor, as illustrated in FIG. 1.

One or more of the reactants may be provided with the aid of a carrier gas, such as Ar or He. In some embodiments the vanadium precursor and the second reactant are provided with the aid of a carrier gas.

In some embodiments, two of the phases may overlap, or be combined. For example, the vanadium precursor and the second reactant may be provided simultaneously in pulses that partially or completely overlap. For example, the vanadium precursor and the second reactant may be co-flowed such that they are delivered to the reaction space at the same time.

In addition, the order of the deposition and etch cycles may be varied, as well as the order of the provision of reactants in each cycle. That is, unless specified otherwise, the deposition-etch cycle can begin with either the deposition cycle or the etch cycle, the reactants can be provided in each cycle in any order, and the cycles may begin with any of the reactants.

Excess reactant and reaction byproducts, if any, can be removed from the vicinity of the substrate, and in particular from the substrate surface, between reactant pulses. In some embodiments the reaction chamber is purged between reactant pulses, such as by purging with an inert gas. The flow rate and time of each reactant, is tunable, as is the removal step, allowing for control of the quality and various properties of the films.

Figure 2:
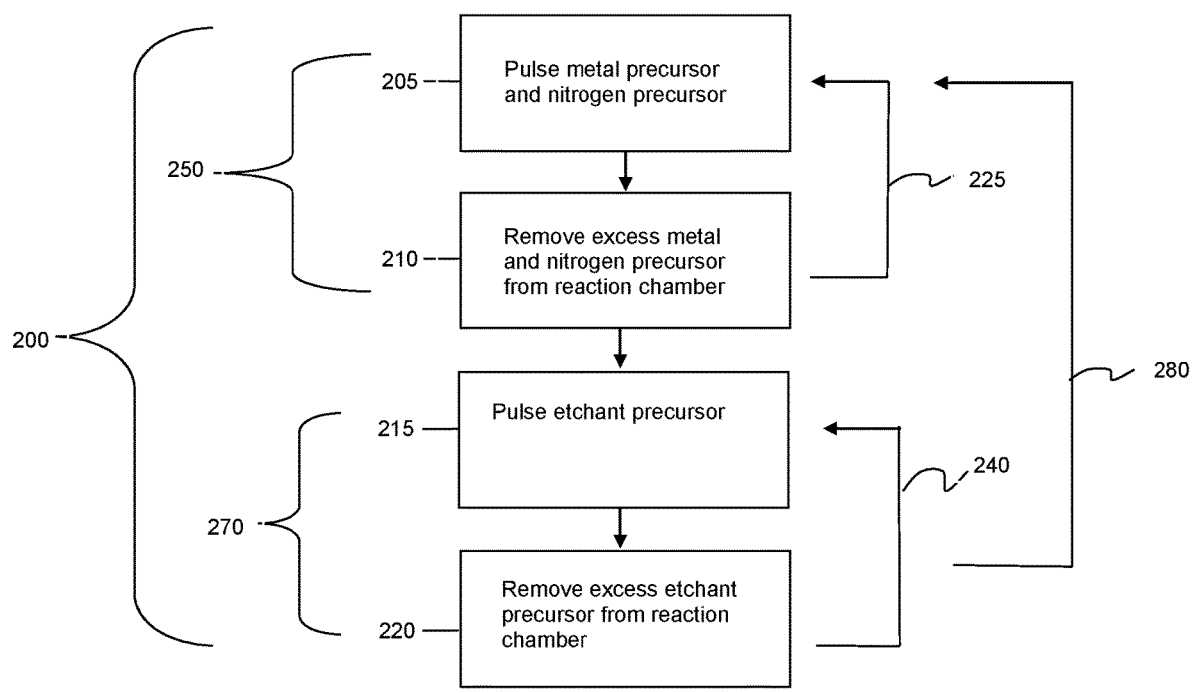
FIG. 2 is a flow chart illustrating a method of forming a metal nitride thin film by a vapor deposition process in accordance with some embodiments of the present disclosure.

In some embodiments a metal nitride is deposited on a three-dimensional feature on a substrate in a reaction space by a CVD-type deposition-etch cycle. An exemplary CVD-type deposition-etch cycle 200 is illustrated in FIG. 2, comprising a metal nitride deposition cycle 250 and an etch cycle 270. In the deposition cycle 250 pulses of the metal precursor and nitrogen precursor are provided to the reaction space 205 where they contact the substrate. Excess precursor and reaction by-products, if any, may be removed from the reaction space 210. The metal nitride deposition cycle may be continued, or repeated 225 until a desired amount of metal nitride has been deposited.

As mentioned above, the metal precursor and nitrogen precursor may be co-flowed into the reaction space. In some embodiments the metal precursor and nitrogen precursor are provided in a pulsed or cyclical CVD process. Thus, they may be provided in distinct pulses, or in pulses that partially or completely overlap.

Following the metal nitride deposition cycle 250 an etch cycle 270 is conducted in which an etchant precursor comprising $VCl_4$ is provided to the reaction space 215. In some embodiments the etchant precursor consists of $VCl_4$. The reaction conditions are selected such that the etchant precursor breaks down into $VCl_2$ and $Cl_2$ and the $Cl_2$ contacts the substrate and etches the deposited metal nitride to a desired degree. Excess etchant precursor and reaction by-products are removed from the reaction space 220. The etch cycle may be repeated 240 two or more times in some embodiments.

The deposition-etch cycle may be repeated 280 two or more times to deposit a desired amount of metal nitride. For example, the deposition-etch cycle may be repeated 280 until a feature on the substrate surface, such as a trench or via, is filled with metal nitride.

As with the ALD-type cycles discussed above, in some embodiments the metal nitride that is deposited by a CVD-type process is vanadium nitride and the metal precursor is a vanadium precursor, such as a vanadium halide. In some embodiments the metal precursor comprises $VCl_4$. In some embodiments the metal nitride that is deposited is titanium nitride and the metal precursor is a titanium precursor, such as a titanium halide. In some embodiments the titanium precursor is $TiCl_4$.

In some embodiments the etchant precursor used in the CVD-type process comprises $VCl_4$. In some embodiments the etchant precursor consists of $VCl_4$.

Figure 3:
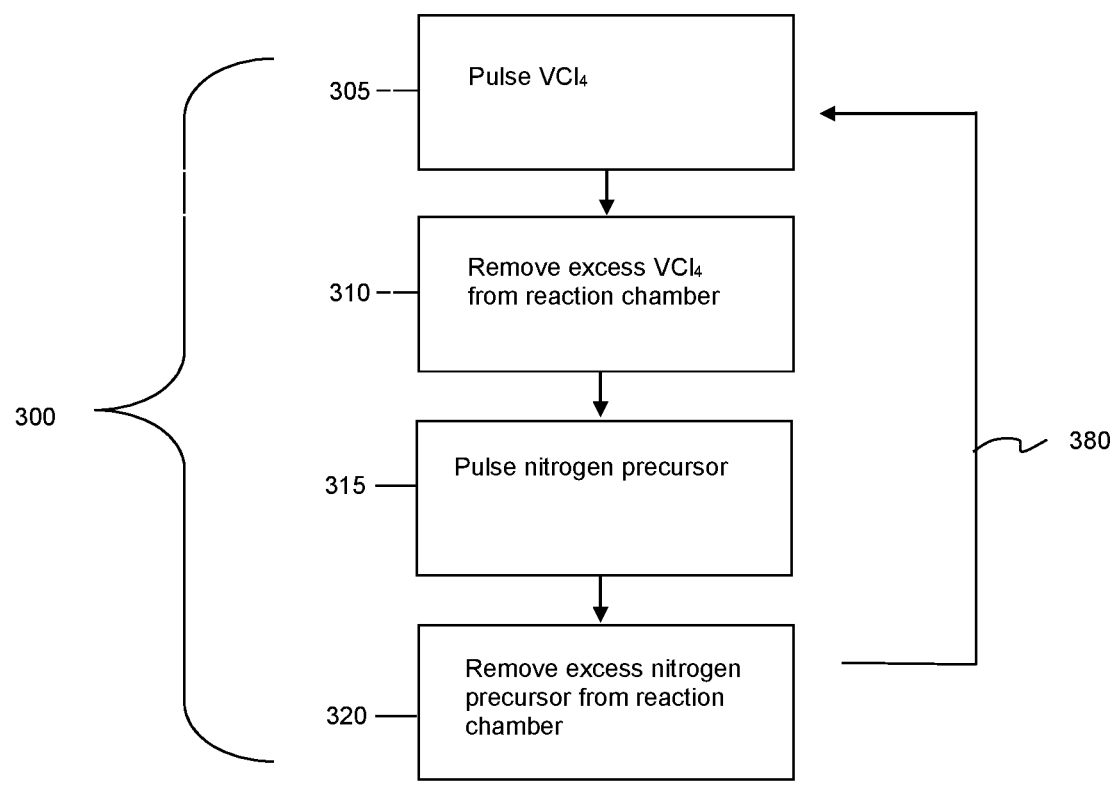
FIG. 3 is a flow chart illustrating a method of forming a vanadium nitride thin film by a vapor deposition process in accordance with some embodiments of the present disclosure.

In some embodiments vanadium nitride is deposited on a substrate having three-dimensional features, such as in a trench or via, by a deposition process comprising a vanadium nitride deposition cycle in which the same pulse of $VCl_4$ serves as both the metal source and the etchant source. That is, in some embodiments for depositing vanadium nitride a separate etch cycle is not included in the deposition process. As illustrated in FIG. 3, in some embodiments vanadium nitride films are deposited on a three-dimensional feature on a substrate in a reaction space, such as a trench or via, by a vapor deposition process 300. A vapor phase vanadium precursor comprising $VCl_4$ is provided to the reaction space comprising the substrate 305 under conditions such that at least some of the $VCl_4$ forms $VCl_2$ and $Cl_2$. Excess VCl4 and reaction byproducts are removed from the reaction space 310. A nitrogen precursor is pulsed into the reaction space 315 and reacts with vanadium species on the substrate surface to form vanadium nitride. Excess nitrogen precursor is removed from the reaction chamber along with reaction byproducts, if any. The vanadium nitride deposition cycle 300 can be repeated two or more times until a desired amount of vanadium nitride is deposited. In subsequent deposition cycles the $Cl_2$ formed from the VCl4 can etch previously deposited vanadium nitride. This self-etching process can allow for bottom up deposition of vanadium nitride in the feature on the substrate, such as a trench or via.

While the vanadium nitride deposition cycle can comprise an ALD type process, as illustrated in FIG. 3, such as plasma-enhanced atomic layer deposition (PEALD) type processes or thermal ALD processes, in some embodiments a vanadium nitride layer is deposited by a deposition cycle comprising a CVD process, such as a thermal CVD process or a plasma-enhanced CVD (PECVD) process. In some embodiments a vanadium nitride layer is deposited by a deposition cycle comprising a cyclical CVD process. In some embodiments a vanadium nitride thin film is deposited by co-flowing a vanadium precursor and a nitrogen precursor into the reaction space containing the substrate.

The formula of the vanadium nitride that is deposited may be generally referred to herein as VN for convenience and simplicity. However, the skilled artisan will understand that the actual formula of the vanadium nitride, representing the V:N ratio in the film and excluding hydrogen or other impurities, can vary.

Figure 4A:
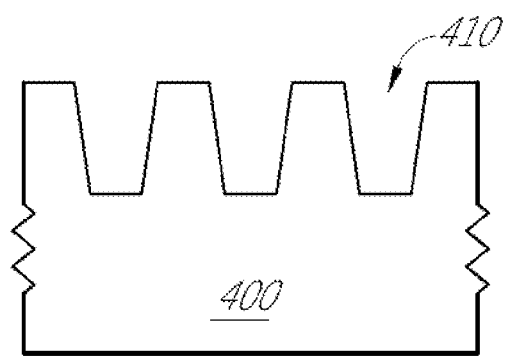
FIGS. 4A-4C are schematic representations of bottom-up filling of trenches with metal nitride in accordance with some embodiments of the present disclosure.
Figure 4B:
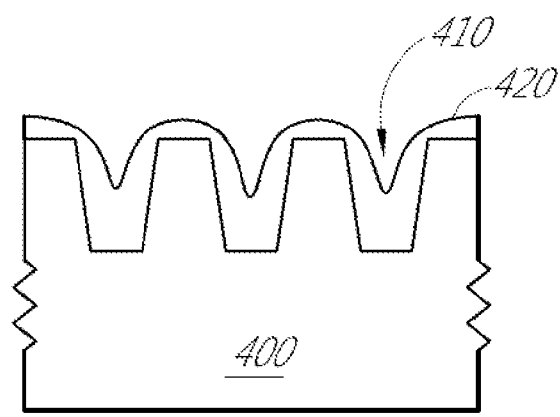
Figure 4C:
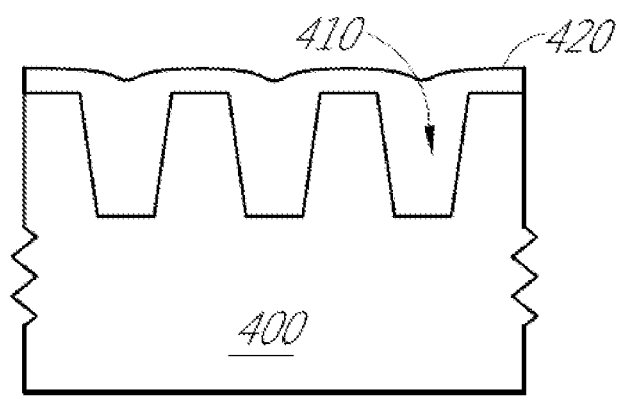

FIGS. 4A-4C are schematic representations of the bottom up gapfill metal nitride processes in accordance with some embodiments. FIG. 4A illustrates a schematic representation of a cross section of a substrate 400 with a pattern of three-dimensional features in the form of trenches 410. In other embodiments, the substrate can have different surface topography. The features can be quite small with high aspect ratios, which ordinarily make it difficult to reach the bottom with deposition and fill gaps in the features, or trenches, without forming voids. In the illustrated embodiment, the features can have lateral dimensions from 5 nm to 10 μm, more particularly about 5 nm to about 500 nm, or about 10 nm to about 200 nm. At the same time, the ratio of height to width, or aspect ratio, of the features, or trenches 410 for the illustrated embodiment, can range between about 0.25 to 1000, about 0.5 to about 100, more particularly about 1.0 to 75, and even more particularly from about 2.0 to about 50. FIG. 4B illustrates a cross section of the substrate 400 where the metal nitride 420 being deposited reduces the aspect ratio of the trenches 410 as the deposition favors the bottom of the features in a bottom-up filling process as described above. FIG. 4C illustrates a cross section of the substrate 400 where the deposited metal nitride film 420 has filled the trenches 410 evenly without any seams visible and without voids. In some embodiments, the deposited metal nitride film decreases the aspect ratio in the three-dimensional structures by a factor more than about 1.5, more than about 5, more than about 25 or in some embodiments by a factor more than about 100. In some embodiments, the deposited metal nitride film decreases the aspect ratio of the feature so that there is no substantial aspect ratio left anymore after the deposition of the metal nitride film. In some embodiments, the deposited metal nitride fills the three-dimensional structures, such as vias or trenches, at least about 50%, at least about 75%, at least about 90%, at least about 95% of the volume of the three-dimensional structure without having any substantial seam or voids in the filled volume. In some embodiments the deposited metal nitride fills the three-dimensional structures, such as vias or trenches, fully.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method for depositing metal nitride on a substrate in a reaction chamber by a vapor deposition process comprising plurality of deposition-etch cycles comprising:
   at least one deposition cycle comprising:
      providing a pulse of a metal precursor into the reaction chamber;

providing a pulse of a nitrogen precursor into the reaction chamber; and removing excess metal precursor and nitrogen precursor from the reaction chamber; and at least one etch cycle comprising:

providing a pulse of an etchant source comprising $VCl_4$ into the reaction chamber; and removing excess etchant source and reaction byproducts from the reaction chamber.

2. The method of claim 1, wherein the metal nitride is vanadium nitride or titanium nitride.

3. The method of claim 2, wherein the metal precursor comprises $VCl_4$.

4. The method of claim 1, wherein the nitrogen precursor comprises at least one of ammonia ($NH_3$), hydrazine ($N_2H_4$) and an alkyl-hydrazine precursor.

5. The method of claim 1, wherein the etchant source consists of $VCl_4$.

6. The method of claim 1, wherein deposition cycle is repeated two or more times prior to conducing an etch cycle.

7. The method of claim 1, wherein deposition-etch cycle is repeated two or more times.

8. The method of claim 1, wherein the substrate comprises a trench.

9. The method of claim 8, wherein the deposition-etch cycle is repeated until 95% of the volume of the trench is filled with metal nitride without having any substantial seam or voids in the filled volume.

10. The method of claim 1, wherein removing excess metal precursor and nitrogen precursor from the reaction chamber comprises removing excess metal precursor after providing the pulse of the metal precursor into the reaction chamber and before providing the pulse of the nitrogen precursor into the reaction chamber.

11. The method of claim 1, wherein removing excess metal precursor and nitrogen precursor from the reaction chamber comprises removing excess metal precursor and excess nitrogen precursor after providing the pulse of the metal precursor into the reaction chamber and after providing the pulse of the nitrogen precursor into the reaction chamber.

12. The method of claim 1, wherein the pulse of the etchant source has a duration that is longer than a duration of the pulse of the metal precursor.

13. The method of claim 1, wherein the etch-deposition cycle is carried out at a temperature between 350 and 450° C.

14. A method of filling a trench in a substrate in a reaction space with vanadium nitride comprising a plurality of vapor deposition cycles comprising:

providing a pulse of vapor phase $VCl_4$ to the reaction space under conditions such that $VCl_2$ and $Cl_2$ are formed in the reaction space; and providing a pulse of a nitrogen reactant to the reaction space, wherein the $Cl_2$ formed in the reaction space preferentially etches vanadium nitride deposited at the top of the trench relative to vanadium nitride deposited at the bottom of the trench.

15. The method of claim 14, wherein method is an atomic layer deposition method.

16. The method of claim 15, additionally comprising removing excess vapor phase $VCl_4$ and reaction byproducts from the reaction space after providing the pulse of vapor phase $VCl_4$ and prior to providing the pulse of the nitrogen reactant to the reaction space.

17. The method of claim 14, wherein the method is a chemical vapor deposition method.

18. The method of claim 17, wherein the pulse of vapor phase $VCl_4$ and the pulse of nitrogen reactant are provided to the reaction space at the same time.

19. The method of claim 14, wherein the conditions comprise a temperature between 350 and 450° C.

* * * * *